(12) United States Patent
O'Brien et al.

(10) Patent No.: US 10,403,811 B2
(45) Date of Patent: Sep. 3, 2019

(54) MAGNETIC DIFFUSION BARRIERS AND FILTER IN PSTTM MTJ CONSTRUCTION

(71) Applicant: Intel Corporation, Santa Clara, CA (US)

(72) Inventors: Kevin P. O'Brien, Portland, OR (US); Kaan Oguz, Hillsboro, OR (US); Brian S. Doyle, Portland, OR (US); Mark L. Doczy, Portland, OR (US); Charles C. Kuo, Hillsboro, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 54 days.

(21) Appl. No.: 15/503,680

(22) PCT Filed: Sep. 26, 2014

(86) PCT No.: PCT/US2014/057872
§ 371 (c)(1),
(2) Date: Feb. 13, 2017

(87) PCT Pub. No.: WO2016/048378
PCT Pub. Date: Mar. 31, 2016

(65) Prior Publication Data
US 2017/0271576 A1    Sep. 21, 2017

(51) Int. Cl.
*G11C 11/16* (2006.01)
*H01L 43/10* (2006.01)
(Continued)

(52) U.S. Cl.
CPC ............ *H01L 43/08* (2013.01); *G11C 11/161* (2013.01); *G11C 11/1659* (2013.01);
(Continued)

(58) Field of Classification Search
None
See application file for complete search history.

(56) References Cited

U.S. PATENT DOCUMENTS 6,888,742 B1   5/2005   Nguyen et al.
8,259,420 B2   9/2012   Zhao et al.
(Continued)

FOREIGN PATENT DOCUMENTS

TW   200952226 A1   12/2009
TW   201135728 A1   10/2011
TW   201234362 A1   8/2012

OTHER PUBLICATIONS

Intel Corporation, "international Preliminary Report on Patentability and Written Opinion", PCT Application No. PCT/US2014/057872, (dated Mar. 28, 2017).
(Continued)

*Primary Examiner* — Jay C Chang
(74) *Attorney, Agent, or Firm* — Schwabe, Williamson & Wyatt, P.C.

(57) ABSTRACT

A material layer stack for a magnetic tunneling junction, the material layer stack including a fixed magnetic layer; a dielectric layer; a free magnetic layer; and an amorphous electrically-conductive seed layer, wherein the fixed magnetic layer is disposed between the dielectric layer and the seed layer. A non-volatile memory device including a material stack including an amorphous electrically-conductive seed layer; and a fixed magnetic layer juxtaposed and in contact with the seed layer. A method including forming an amorphous seed layer on a first electrode of a memory device; forming a material layer stack on the amorphous seed layer, the material stack including a dielectric layer disposed between a fixed magnetic layer and a free magnetic layer, wherein the fixed magnetic layer.

17 Claims, 4 Drawing Sheets

(51) Int. Cl.
  *H01L 43/02* (2006.01)
  *H01L 43/08* (2006.01)
  *H01L 43/12* (2006.01)
  *H01F 10/32* (2006.01)

(52) U.S. Cl.
  CPC ......... *H01F 10/3295* (2013.01); *H01L 43/02* (2013.01); *H01L 43/10* (2013.01); *H01L 43/12* (2013.01)

(56) References Cited

U.S. PATENT DOCUMENTS

| | | |
|---|---|---|
| 8,592,927 B2 | 11/2013 | Jan et al. |
| 2005/0174834 A1 | 8/2005 | Kim et al. |
| 2011/0318848 A1 | 12/2011 | Choi et al. |
| 2012/0068284 A1 | 3/2012 | Kitagawa et al. |
| 2012/0243305 A1* | 9/2012 | Nakayama ............ H01L 27/228 365/158 |
| 2013/0196177 A1* | 8/2013 | Nagata ................... G11B 5/72 428/835.2 |
| 2014/0084398 A1 | 3/2014 | Oguz et al. |
| 2014/0340183 A1* | 11/2014 | Nakada ................... H01L 43/02 336/30 |

OTHER PUBLICATIONS

Hindmarch, Aidan T., et al., "Zirconium as a Boron Sink in Crystalline CoFeB/MgO/CoFeB Magnetic Tunnel Junctions", The Japan Society of Applied Physics, Applied Physics Express 2, pp. 1-3, (2011).

Intel Corporation, "International search report and written opinion", PCT Application No. PCT/US2014/057872 (dated May 21, 2015).

Search Report and Written Opinion for EP 14902797, dated May 3, 2018, 9 pages.

Sato H et al.: "Properties of magnetic tunnel junctions with a Mg0/coFeB/Ta/CoFeB/MgO recprdomg structure down to junction diameter of 11nm", Applied Physics Letters, col. 105, No. 6, 062403, dated Aug. 13, 2014.

Office Action from Taiwan Patent Application No. 104127902, dated Nov. 26, 2018, 15 pgs.

* cited by examiner

MAGNETIC DIFFUSION BARRIERS AND FILTER IN PSTTM MTJ CONSTRUCTION

CROSS-REFERENCE TO RELATED APPLICATION

This patent application is a U.S. National Phase Application under 35 U.S.C. § 371 of International Application No. PCT/US2014/057872, filed Sep. 26, 2014, entitled MAGNETIC DIFFUSION BARRIERS AND FILTER IN PSTTM MTJ CONSTRUCTION.

BACKGROUND

Field

Memory devices and, in particular, spin transfer torque memory (STTM) devices.

Description of Related Art

The scaling of features in integrated circuits has been a driving force behind an ever-growing semiconductor industry. Scaling to smaller and smaller features generally enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

The operation of spin torque devices is based on the phenomenon of spin transfer torque. If a current is passed through a magnetization layer, called the fixed magnetic layer, it will be spin polarized. With the passing of each electron, its spin (angular momentum) will be transferred to the magnetization in the next magnetic layer, called the free magnetic layer, and will cause a small change on the magnetization of such next layer. This is, in effect, a torque-causing precession of magnetization. Due to reflection of electrons, a torque is also exerted on the magnetization of an associated fixed magnetic layer. In the end, if the current exceeds a certain critical value (given by damping and spin transfer efficiency caused by the magnetic material and its environment), the magnetization of the free magnetic layer will be switched by a pulse of current, typically in about one to tens nanoseconds. Magnetization of the fixed magnetic layer may remain unchanged since an associated current is below its threshold due to geometry, magnitization or due to an adjacent anti-ferromagnetic layer.

Spin-transfer torque can be used to flip the active elements in magnetic random access memory. Spin-transfer torque memory, or STTM, has the advantages of lower power consumption and better scalability over conventional magnetic random access memory (MRAM) which uses magnetic fields to flip the active elements

DETAILED DESCRIPTION

Spin transfer torque memory (STTM) devices and memory arrays with enhanced stability and methods of fabricating STTM devices and memory arrays with enhanced stability are described. In the following description, numerous specific details are set forth, such as specific magnetic layer integration and material regimes, in order to provide a thorough understanding of embodiments. It will be apparent to one skilled in the art that embodiments may be practiced without these specific details. In other instances, well-known features, such as integrated circuit design layouts, are not described in detail in order to not unnecessarily obscure embodiments. Furthermore, it is to be understood that the various embodiments shown in the figures are illustrative representations and are not necessarily drawn to scale.

One or more embodiments are directed to methodologies for increasing stability in perpendicular STTM systems. Applications may include use in embedded memory, embedded non-volatile memory (NVM), magnetic random access memory (MRAM), magnetic tunnel junction (MTJ) devices, NVM, perpendicular MTJ, STTM, and non-embedded or stand-alone memories. In an embodiment, stability in perpendicular STTM devices is achieved by including an insertion layer and/or filter layer that has a weak magnetic flux adjacent the free magnetic layer and the fixed magnetic layer, respectively. In one embodiment, a weak magnetic flux is a magnetic flux of a magnetic flux of 0.1 tesla to one tesla. In one embodiment, such insertion layer and/or filter layer is juxtaposed and in contact with the free magnetic layer and fixed magnetic layer, respectively, as is described in greater detail below. In another embodiment, both an insertion layer and a filter layer are each of a material having a weak magnetic flux.

Figure 1:
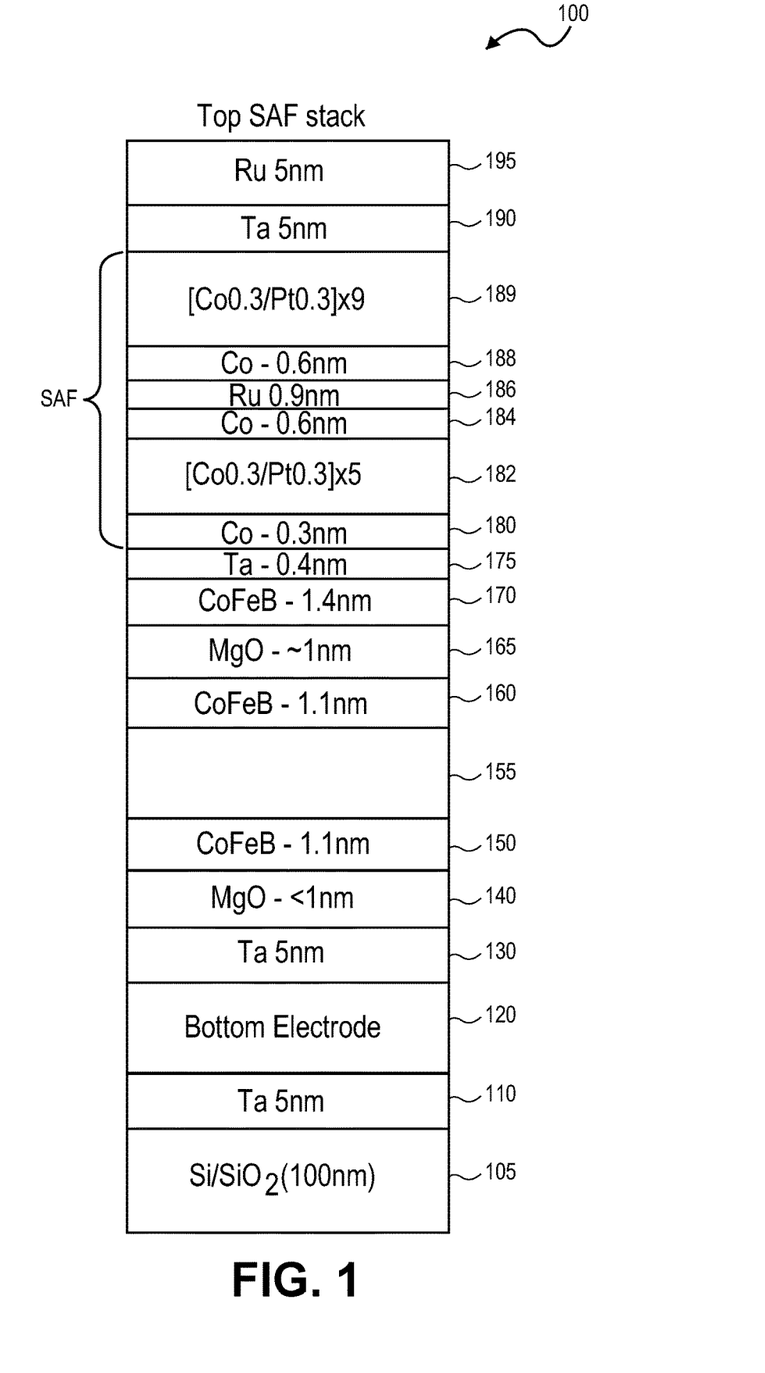
FIG. 1 shows a cross-sectional view of a material layer stack for an embodiment of a spin transfer torque memory (STTM) device.

FIG. 1 illustrates a cross-sectional view of an embodiment of a material layer stack for a spin transfer torque memory (STTM) device specifically a perpendicular STTM device. The various layers of the memory stack will be described from bottom to top (as viewed in FIG. 1) with each subsequent layer juxtaposed and in contact with the previously described layer. FIG. 1 shows a material layer stack of various layers illustrated as rectangles. The memory stack is indicated as multiple layers each having a rectangular shape. It is appreciated that a cross-sectional shape of a layer can representatively depend on, among other things, a material property, an introduction technique and/or tool, and a shape (e.g., surface) of any underlying layer. Therefore, an illustration as a rectangular shape should be broadly interpreted to include other possible cross-sectional shapes including, but not limited to, trapezoidal, a parallelogram, or other polygonal shape.

Referring to FIG. 1, material layer stack 100 includes amorphous conductive layer 110 of, for example, tantalum having a representative thickness of 5 nanometers (nm). Conductive layer 110 is formed on film 105 of, for example, silicon with an oxide formed thereon (e.g., 100 nm thickness). Juxtaposed and in contact with amorphous conductive layer 110 is first electrode 120. In one embodiment, first electrode 120 is a ruthenium material that has at least a partially crystalline form. An at least partially crystalline form or structure, as used herein to describe a material layer includes a material layer that has a partially crystalline form or structure (e.g., 50 percent crystalline, 75 percent crystalline, 85 percent crystalline) or a material layer that has a fully crystalline form or structure (100 percent crystalline). On or overlying first electrode 120 is electrically conductive layer 130 of, for example, a non-ferromagnetic material such as tantalum that has a crystalline form and a representative thickness of 5 nm—some of the Ta is amorphous. In another embodiment, an integrated circuit device interconnect (e.g., a copper interconnect on a semiconductor devices substrate) may be used as the first electrode and replace each of layer 110, first electrode 120 and layer 130.

Continuing with a description of memory stack 100 in FIG. 1, on conductive layer 130 is seed layer 140. In one embodiment, material stack 100 is fabricated to provide a perpendicular magnetic anisotropy. Seed layer is a material selected to improve an interface anisotropy of a free magnetic layer in memory stack 100. In one embodiment, seed layer 140 is magnesium oxide (MgO) in an at least partially crystalline form and a representative thickness of less than 1 nm. On seed layer 140 is an optional free magnetic seed layer 150 of a material for free magnetic layer. In one embodiment, a material of free magnetic seed layer 150 and a material of a fixed magnetic layer are each cobalt-iron-boron (CoFeB). Generally, CoFeB is deposited in an amorphous form. Optional free magnetic seed layer 150 is deposited to a representative thickness of 1.1 nm.

On optional free magnetic seed layer 150 in memory stack 100 of FIG. 1 is insertion layer 155. On insertion layer 155 is free magnetic layer 160. In one embodiment, insertion layer 155 includes a material that has a weak magnetic flux. A material with weak magnetic flux, in one embodiment, is one with a magnetic flux up to 1 tesla. In other embodiment, a material has a magnetic flux of less than 1 tesla. In a further embodiment, a material has a magnetic flux between 0.1 tesla and one tesla.

In one embodiment, where a material of free magnetic layer of memory stack 100 is CoFeB, a material of insertion layer 155 is a material that can act as a boron sink to attract boron (selectively relative to cobalt and iron). A material that has a property to attract boron, for example, on a thermal treatment of the stack will facilitate a transition of a CoFeB free layer from an amorphous to a crystalline form. A material of insertion layer 155 is also a material that has a property to couple free magnetic seed layer 150 with free magnetic layer 160 disposed on insertion layer 155. A weakly magnetic material (e.g., a magnetic flux of one tesla or less) will foster or promote direct magnetic coupling of free magnetic seed layer 150 and free magnetic layer 160. In one embodiment, a surface anisotropy between insertion layer 155 and an adjacent free magnetic layer is greater than 0.5 millijoules per square meter (mJ/m$^2$).

Suitable materials for insertion layer 155 include amorphous materials such as cobalt zirconium tantalum (CZT) and at least partially crystalline materials such as heterostructures or alloys iron/tantalum, cobalt/tantalum, iron/ruthenium, hafnium/iron, tungsten/iron, zirconium/iron, hafnium/nickel, zirconium/cobalt and cobalt/ruthenium. A representative thickness of insertion layer 155 is on the order of 3 angstroms (Å) to 20 Å.

In one embodiment, free magnetic layer 160 of memory stack 100 of FIG. 1 is CoFeB having a representative thickness of 1.1 nm. On free magnetic layer 160 in memory stack 100 is dielectric layer 165. In one embodiment, a material for dielectric layer 165 is an oxide such as magnesium oxide (MgO). A representative thickness of an MgO layer is about 1 nm. Dielectric layer of MgO is introduced as an at least partially crystalline structure that will influence a crystallization of underlying free magnetic layer 160. As noted above, the presence of insertion layer 155 as a boron sink will encourage crystallization of a free magnetic layer of CoFeB by attracting boron atoms away from the CoFeB material upon the addition of heat.

On dielectric layer 165 in memory stack 100 is fixed magnetic layer 170. In one embodiment, fixed magnetic layer 170 is CoFeB having a thickness on the order of 1.4 nm. In one embodiment, fixed magnetic layer 170 has an at least partially crystalline form.

On fixed magnetic layer 170 is filter layer 175. In one embodiment, filter layer 175 is a material that will allow boron in fixed magnetic layer 170 of CoFeB to diffuse through the filter layer selective to cobalt and iron (allow movement of boron but not cobalt or iron). Filter layer 175 is also a material that provides good anisotropy at an interface. One suitable material for filter layer 175 is tantalum. A representative thickness of a tantalum filter layer is 0.4 nm.

On filter layer 175 in memory stack 100 of FIG. 1 is a synthetic antiferromagnet (SAF) of multiple layers of material. In one embodiment, as illustrated in memory stack 100 from bottom to top with each subsequent layer juxtaposed and in contact with the previously described layer, SAF includes cobalt layer 184 having a representative thickness of 0.3 nm; cobalt-platinum heterostructure layer 182 (e.g., [Co0.3 nm/Pt0.3 nm]×5); cobalt layer 184 having a representative thickness of 0.6 nm; ruthenium layer 186 having a representative thickness of 0.9 nm; cobalt layer 188 having a representative thickness of 0.6 nm; and cobalt-platinum heterostructure layer 189 (e.g., [Co0.3 nm/Pt0.3 nm]×9). Without wishing to be bound by theory, for a perpendicular memory stack, a SAF based on a CoPt ferromagnet heterostructure coupled by a ruthenium layer through an RKKY interaction means the CoPt heterostructures on opposing sides of the ruthenium layer will tend to have perpendicular magnetic moments but in opposite directions. It is appreciated that the foregoing is one representative example of an SAF for a perpendicular memory stack.

On the SAF stack of material layer stack 100 in FIG. 1 is conductive layer 190 of a non-ferromagnetic material such as a tantalum (e.g., 5 nm) followed by second electrode 195 of, for example, a ruthenium material having a representative thickness of 5 nm. In another embodiment, second electrode 195 and optionally conductive layer 190 may be replaced with a device interconnect.

Figure 2:
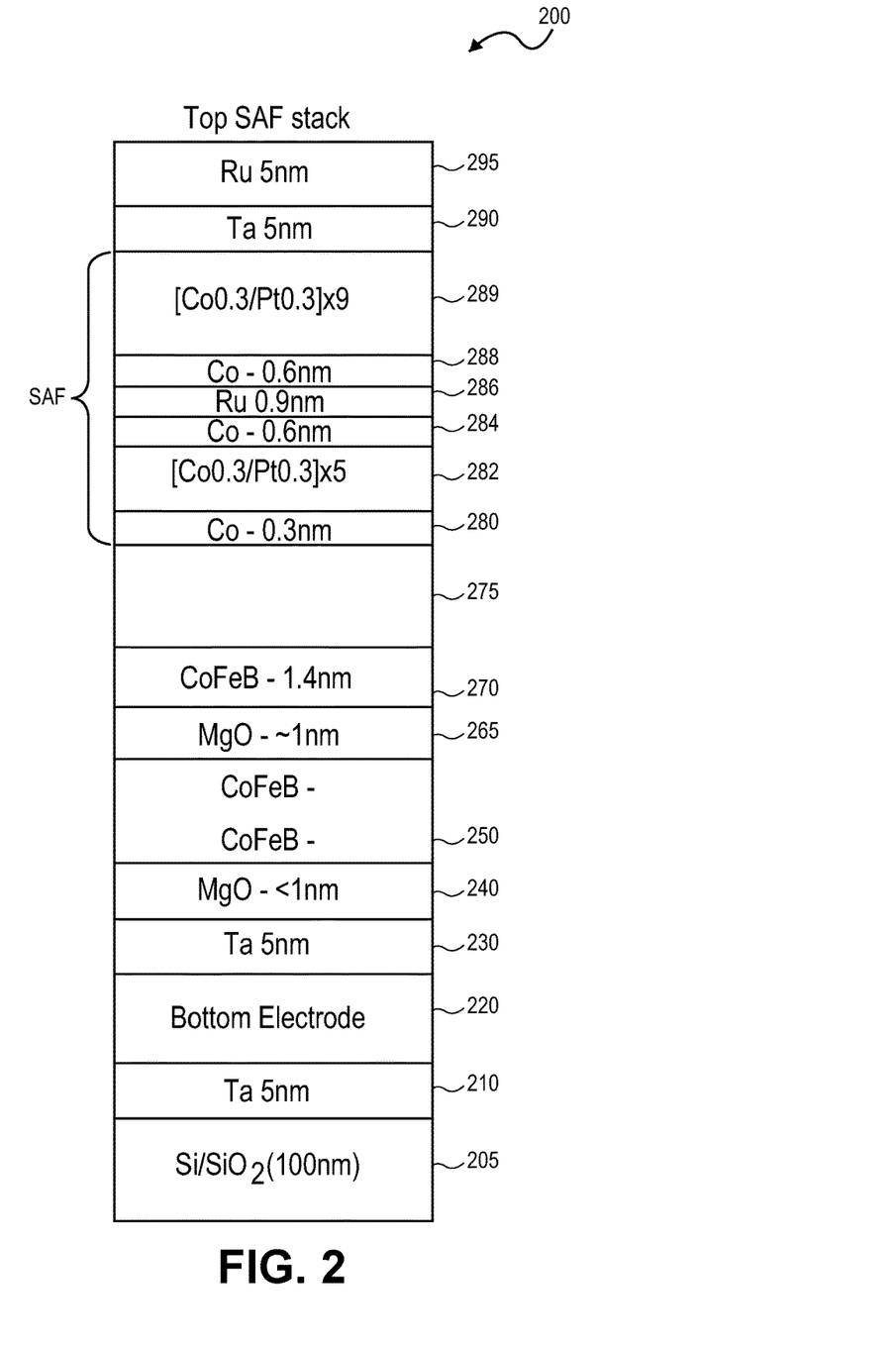
FIG. 2 shows a cross-sectional view of a material layer stack for a second embodiment of a spin transfer torque memory (STTM) device.

FIG. 2 illustrates a cross-sectional side view of a second embodiment of a material layer stack for a perpendicular STTM device. The various layers will be described from bottom to top (as viewed) with each subsequent layer juxtaposed and in contact with the previously described layer. As with FIG. 1, the layers are indicated as rectangles. It is appreciated that an actual cross-sectional shape of any of the layers will depend on, among other things, a property of a material, an introduction technique and/or tool and a shape (e.g., surface) of any underlying layer. Therefore, an illustration as rectangular shapes should be broadly interpreted to include other possible cross-sectional shapes including, but not limited to, trapezoidal, a parallelogram, a convex polygon or some combination of shapes.

Referring to FIG. 2, material layer stack 200 includes amorphous conductive layer 210 on single crystal silicon 205 having an oxide film thereon (e.g., 100 nm). Amorphous conductive layer 210 is, for example, a tantalum material having a representative thickness of 5 nm. Disposed on conductive layer 210 is first electrode 220 of, for example, a ruthenium material having a crystalline form. On first electrode 220 is electrically conductive layer 230 of, for example, a non-ferromagnetic material such as tantalum having a representative thickness of 5 nm and a crystalline form. In another embodiment, a device interconnect may be substituted for each of conductive layer 210, first electrode 220 and conductive layer 230.

On conductive layer 230 in material layer stack 200 is seed layer 240 of, for example, MgO in an amorphous form and a representative thickness of less than 1 nm. As noted above, in one aspect, seed layer 240 is a material selected to improve an interface anisotropy of a subsequently introduced free magnetic layer in the stack.

On seed layer 240 in material layer stack 200 is free magnetic layer 250. In one embodiment, free magnetic layer 250 is a CoFeB having a thickness on the order of 2 nm or less and an at least partially crystalline form. On free magnetic layer 250 is dielectric layer 265 of, for example, MgO having a thickness on the order of 1 nm and an at least partially crystalline form. On dielectric layer 250 is fixed magnetic layer 270 of, for example, CoFeB having a representative thickness of 1.4 nm and an at least partially crystalline form. Collectively, free magnetic layer 250, dielectric layer 265 and fixed magnetic layer 270 characterize a magnetic tunnel junction (MTJ) portion of material layer stack 200.

On fixed magnetic layer 270 in material layer stack 200 of FIG. 2 is filter layer 275. In one embodiment, a material of filter layer 275 has properties similar to a material of insertion layer 155 described in reference to material layer stack 100 of FIG. 1. A material for filter layer 275 is a one that can act as a weak magnet and thus has a magnetic flux of 1 tesla or less, or in another embodiment, a magnetic flux less than 1 tesla, and in a further embodiment, a magnetic flux between 0.1 and 1 tesla. A material of filter layer 275 is also one that allows boron to pass through to foster the crystallization of fixed magnetic layer 270. While allowing the diffusion of boron therethrough, a material of filter layer 275 is also selected, in one embodiment, to inhibit the diffusion of iron. Still further, in one embodiment, a material of filter layer 275 is selected to ferromagnetic ally couple fixed magnetic layer 275 with SAF layers introduced on filter layer 275. In one embodiment, a surface anisotropy between filter layer 275 and adjacent fixed magnetic layer 270 is greater than 0.5 mJ/m$^2$. Suitable materials for filter layer include amorphous materials such as cobalt zirconium tantalum and generally crystalline materials such as heterostructures or alloys iron/tantalum, cobalt/tantalum, iron/ruthenium, hafnium/iron, tungsten/iron, zirconium/iron, hafnium/nickel, zirconium/cobalt and cobalt/ruthenium.

As noted, on filter layer 275 of material layer stack 200 are SAF layers. FIG. 2 representatively shows from bottom to top each layer juxtaposed and in contact with the next, cobalt layer 184 having a representative thickness of 0.3 nm; cobalt-platinum heterostructure layer 182 (e.g., [Co0.3 nm/Pt0.3 nm]×5); cobalt layer 184 having a representative thickness of 0.6 nm; ruthenium layer 186 having a representative thickness of 0.9 nm; cobalt layer 188 having a representative thickness of 0.6 nm; and cobalt-platinum heterostructure layer 189 (e.g., [Co0.3 nm/Pt0.3 nm]×9). It is appreciated that the foregoing is one representative example of an SAF for a perpendicular memory stack.

On the SAF stack of material layer stack 200 in FIG. 2 is conductive layer 290 of a non-ferromagnetic material such as a tantalum (e.g., 5 nm) followed by second electrode 295 of, for example, a ruthenium material having a representative thickness of 5 nm. In another embodiment, second electrode 295 and optionally conductive layer 290 may be replaced with a device interconnect.

In the above embodiments illustrated with reference to FIG. 1 and FIG. 2, a device stack had either a weakly magnetic insertion layer (FIG. 1) or a weakly magnetic filter layer (FIG. 2). In another embodiment, a device stack includes a weakly magnetic insertion layer and a weakly magnetic filter layer. Such embodiment may be realized, for example, by replacing a material for filter layer 175 as described with reference to FIG. 1 (e.g., tantalum) with a material for filter layer 275 described with reference to FIG. 2 (e.g., CZT or a weakly magnetic alloy).

In certain aspects and at least some embodiments, certain terms hold certain definable meanings. For example, a "free" magnetic layer is a magnetic layer storing a computational variable. A "fixed" magnetic layer is a magnetic layer with fixed magnetization (magnetically harder and/or more stable than the free magnetic layer). A tunneling barrier, such as a tunneling dielectric or tunneling oxide, is one located between free and fixed magnetic layers. A fixed magnetic layer may be patterned to create inputs and outputs to an associated circuit. Magnetization may be written by spin transfer torque effect while passing a current through the input electrodes. Magnetization may be read via the tunneling magneto-resistance effect while applying voltage to the output electrodes. In an embodiment, the role of the dielectric layer 208 is to cause a large magneto-resistance ratio. The magneto-resistance is the ratio of the difference between resistances when the two ferromagnetic layers have anti-parallel magnetizations and the resistance of the state with the parallel magnetizations.

Methods of fabricating the stack of layers 100 for, e.g., a spin transfer torque memory bit cell may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, and/or any other associated action with microelectronic component fabrication.

Figure 3:
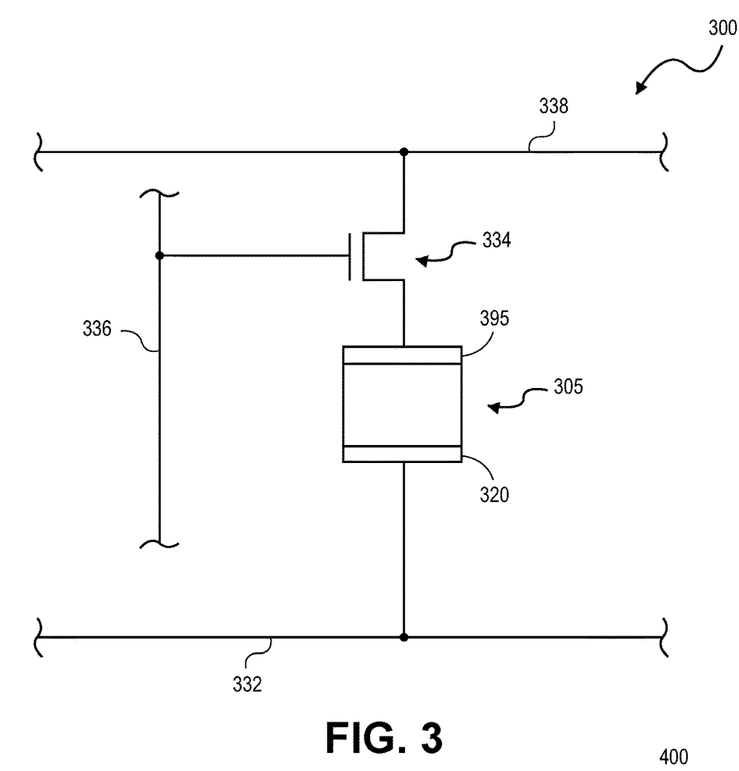
FIG. 3 illustrates a schematic of a spin transfer torque memory bit cell which includes a spin transfer torque element, in accordance with an embodiment.

A stack of layers including magnetic material layers and a conductive oxide layer, e.g., which are used in a magnetic tunneling junction such as shown in FIG. 1 or FIG. 2 may be used to fabricate as memory bit cell. FIG. 3 illustrates a schematic of a spin transfer torque memory bit cell 300 which includes a spin transfer torque element 305.

Referring to FIG. 3, cell 305, in one embodiment, includes a material stack as described with reference to FIG. 1 or FIG. 2. FIG. 3 shows memory stack 305 including first electrode 320 and second electrode 395. Disposed between the first and second electrodes is a magnetic tunnel junction (MTJ) and an insertion layer or filter layer as described above.

In an embodiment, spin transfer torque element 305 is based on perpendicular magnetism. First electrode 320 is electrically connected to a bit line 332. Second electrode 390 is electrically connected with transistor 334. Transistor 334 is connected with word line 336 and source line 338 in a manner that will be understood to those skilled in the art. Spin transfer torque memory bit cell 300 may further include additional read and write circuitry (not shown), a sense amplifier (not shown), a bit line reference (not shown), and the like, as will be understood by those skilled in the art, for the operation of the spin transfer torque memory bit cell 300. It is to be understood that a plurality of the spin transfer torque memory bit cells 300 may be operably connected to one another to form a memory array (not shown), wherein the memory array can be incorporated into a non-volatile memory device. It is to be understood that the transistor 334 may be connected to fixed magnetic layer electrode 350 or the free magnetic layer electrode 370, although only the latter is shown.

to fabricate as memory bit cell. FIG. 3 illustrates a schematic of a spin transfer torque memory bit cell 300 which includes a spin transfer torque element 305.

Referring to FIG. 3, cell 305 includes a material stack of amorphous conductive layer 310 of, for example, tantalum; first electrode 320 of, for example, ruthenium; conductive layer 330 of, for example, tantalum; seed layer 340 of, for example, graphite or a metal oxide; fixed magnetic layer 350 of CoFeB; dielectric layer 360 of MgO; free magnetic layer 370 of CoFeB; conductive layer 380 of, for example, tantalum; and second electrode 190 of, for example, ruthenium.

In an embodiment, spin transfer torque element 305 is based on perpendicular magnetism. First electrode 320 may be electrically connected to a bit line 332. Second electrode 390 may be coupled with a transistor 334. Transistor 334 may be connected with word line 336 and source line 338 in a manner that will be understood to those skilled in the art. Spin transfer torque memory bit cell 300 may further include additional read and write circuitry (not shown), a sense amplifier (not shown), a bit line reference (not shown), and the like, as will be understood by those skilled in the art, for the operation of the spin transfer torque memory bit cell 300. It is to be understood that a plurality of the spin transfer torque memory bit cells 300 may be operably connected to one another to form a memory array (not shown), wherein the memory array can be incorporated into a non-volatile memory device. It is to be understood that the transistor 334 may be connected to the fixed magnetic layer electrode 316 or the free magnetic layer electrode 312, although only the latter is shown.

Figure 4:
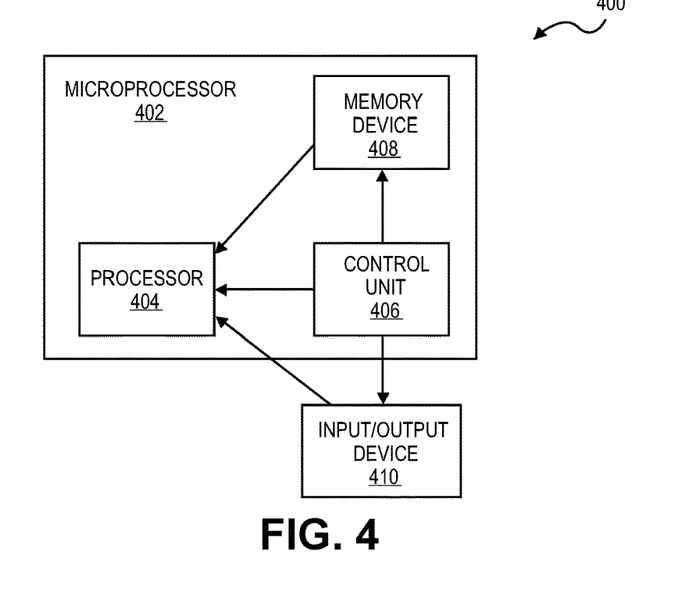
FIG. 4 illustrates a block diagram of an electronic system, in accordance with an embodiment.

FIG. 4 illustrates a block diagram of electronic system 400, in accordance with an embodiment. Electronic system 400 can correspond to, for example, a portable system, a computer system, a process control system, or any other system that utilizes a processor and an associated memory. Electronic system 400 may include microprocessor 402 (having processor 404 and control unit 406), memory device 408, and input/output device 410 (it is to be understood that electronic system 400 may have a plurality of processors, control units, memory device units and/or input/output devices in various embodiments). In one embodiment, electronic system 400 has a set of instructions that define operations which are to be performed on data by processor 404, as well as, other transactions between processor 404, memory device 408, and input/output device 410. Control unit 406 coordinates the operations of processor 404, memory device 408 and input/output device 410 by cycling through a set of operations that cause instructions to be retrieved from memory device 408 and executed. Memory device 408 can include memory bit cells as described above. In an embodiment, memory device 408 is embedded in microprocessor 402, as depicted in FIG. 4.

Figure 5:
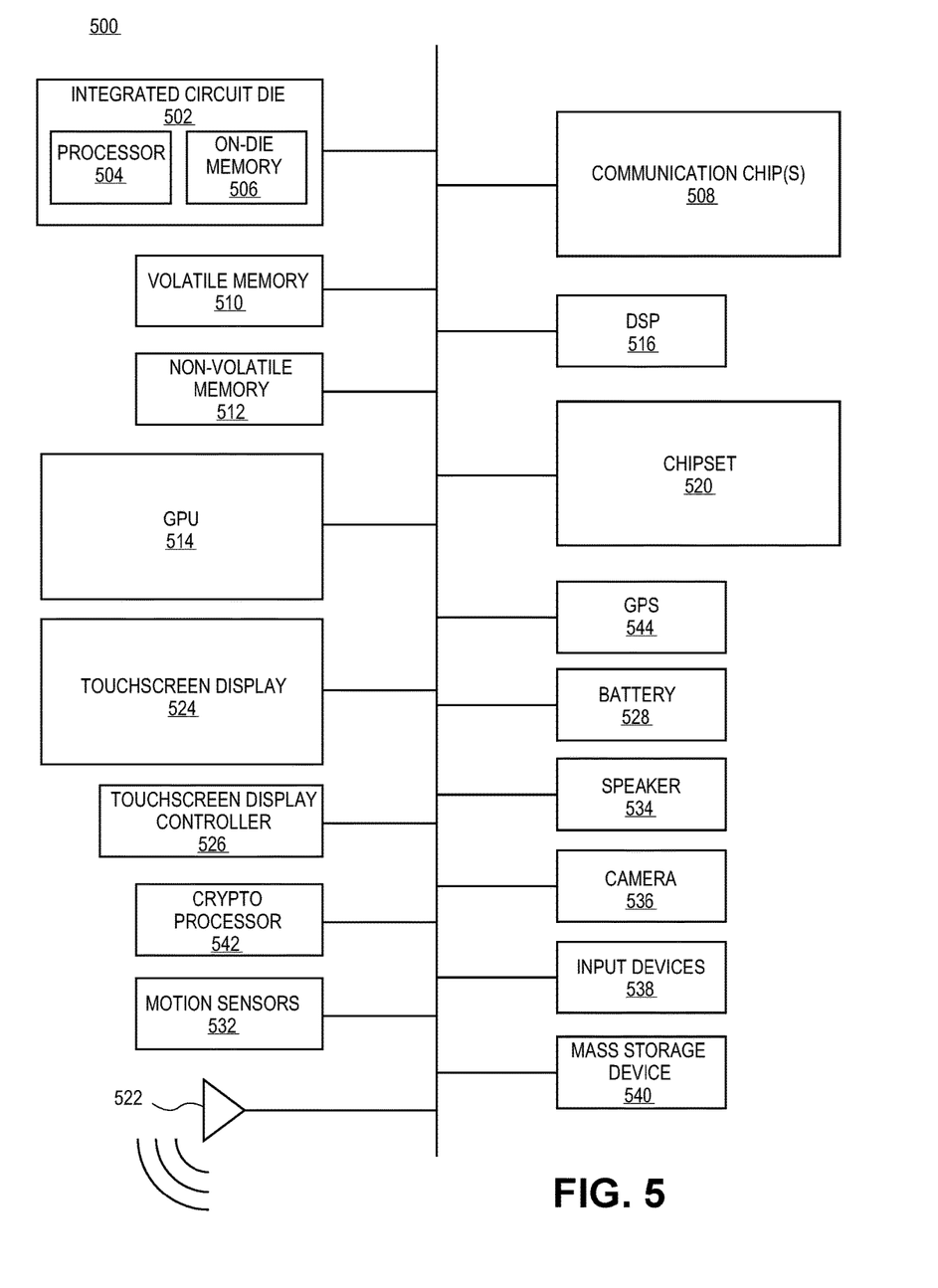
FIG. 5 illustrates an embodiment of a computing device.

FIG. 5 illustrates computing device 500 in accordance with one embodiment. Computing device 500 may include a number of components. In one embodiment, these components are attached to one or more motherboards. In an alternate embodiment, these components are fabricated onto a single system-on-a-chip (SoC) die rather than a motherboard. The components in computing device 500 include, but are not limited to, integrated circuit die 502 and at least one communication chip 508. In some implementations communication chip 508 is fabricated as part of integrated circuit die 502. The integrated circuit die 502 may include CPU 504 as well as on-die memory 506, often used as cache memory, that can be provided by spin-transfer torque memory including cells as described above including a material stack of an amorphous conductive seed layer juxtaposed and in contact with a fixed magnetic layer.

Computing device 500 may include other components that may or may not be physically and electrically coupled to the motherboard or fabricated within an SoC die. These other components include, but are not limited to, volatile memory 510 (e.g., STTM or STTM-RAM with cells as described above), non-volatile memory 512 (e.g., ROM or flash memory), graphics processing unit 514 (GPU), digital signal processor 516, crypto processor 542 (a specialized processor that executes cryptographic algorithms within hardware), chipset 520, antenna 522, display or touchscreen display 524, touchscreen controller 526, battery 528 or other power source, a power amplifier (not shown), global positioning system (GPS) device 544, compass 530, motion coprocessor or sensors 532 (that may include an accelerometer, a gyroscope, and a compass), speaker 534, camera 536, user input devices 538 (such as a keyboard, mouse, stylus, and touchpad), and mass storage device 540 (such as hard disk drive, compact disk (CD), digital versatile disk (DVD), and so forth).

Communications chip 508 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 508. For instance, first communication chip 508 may be dedicated to shorter range wireless communications such as Wi-Fi and Bluetooth and second communication chip 508 may be dedicated to longer range wireless communications such as GPS, EDGE, GPRS, CDMA, WiMAX, LTE, Ev-DO, and others.

Processor 504 of computing device 500 includes one or more devices, such as transistors or metal interconnects. The term "processor" may refer to any device or portion of a device that processes electronic data from registers and/or memory to transform that electronic data into other electronic data that may be stored in registers and/or memory.

Communication chip 508 may also include one or more devices, such as transistors or metal interconnects, that are formed in accordance with embodiments.

In various embodiments, computing device 500 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 500 may be any other electronic device that processes data.

Examples

Example 1 is a material layer stack for a magnetic tunneling junction, the material layer stack including a dielectric layer between a fixed magnetic layer and a free magnetic layer; a filter layer adjacent the fixed magnetic layer; and an insertion layer adjacent the free magnetic layer, wherein at least one of the insertion layer and the filter layer comprises a material having a magnetic flux density of one tesla or less.

In Example 2, the magnetic flux density of the material of the at least one of the insertion layer and the filter layer of the material layer stack of Example 1 is in the range of 0.1 tesla to 1 tesla.

In Example 3, each of the insertion layer and the filter layer of the material layer stack of any of Examples 1 or 2 includes a material having a magnetic flux density of one tesla or less.

In Example 4, the material of the at least one of the insertion layer and the filter layer of the material layer stack of Example 1 is amorphous.

In Example 5, the material of the material layer stack of Example 4 includes cobalt zirconium tantalum.

In Example 6, the material of the at least one of the insertion layer and the filter layer of the material layer stack of any of Examples 1 or 2 is at least partially crystalline.

In Example 7, the material of the at least one of the insertion layer and the filter layer of the material layer stack of any of Examples 1 or 2 is an alloy.

In Example 8, the surface anisotropy between the at least one of the insertion layer and the filter layer and the corresponding magnetic layer of the material layer stack of any of Examples 1 or 2 is greater than 0.5 millijoules per square meter.

Example 9 is a nonvolatile memory device including a material stack including a dielectric layer between a fixed magnetic layer and a free magnetic layer; a filter layer adjacent the fixed magnetic layer; an insertion layer adjacent the free magnetic layer, wherein at least one of the insertion layer and the filter layer comprises a material having a magnetic flux density of one tesla or less; a first electrode disposed on a first side of the material stack; a second electrode disposed on a second side of the material stack; and a transistor device coupled to the first electrode or the second electrode.

In Example 10, the magnetic flux density of the material of the at least one of the insertion layer and the filter layer of the nonvolatile memory device of Example 9 is in the range of 0.1 tesla to 1 tesla.

In Example 11, each of the insertion layer and the filter layer of the nonvolatile memory device of any of Examples 9 or 10 includes a material having a magnetic flux density of one tesla or less.

In Example 12, the material of the at least one of the insertion layer and the filter layer of the nonvolatile memory device of any of Examples 9 or 10 is amorphous.

In Example 13, the material of the at least one of the insertion layer and the filter layer of the nonvolatile memory device of any of Examples 9 or 10 is at least partially crystalline.

In Example 14, the material of the at least one of the insertion layer and the filter layer of the nonvolatile memory device of any of Examples 9 or 10 is an alloy.

In Example 15, the surface anisotropy between the at least one of the insertion layer and the filter layer and the corresponding fixed magnetic layer and free magnetic layer of the nonvolatile memory device of any of Examples 9 or 10 is greater than 0.5 millijoules per square meter.

Example 16 is a method including forming an insertion layer including a material having a magnetic flux density of one tesla or less on a first electrode of a memory device; forming a material layer stack on the insertion layer, the material layer stack including a dielectric layer between a fixed magnetic layer and a free magnetic layer, wherein the insertion layer is juxtaposed and in contact with the free magnetic layer; and forming a second electrode on the material stack.

In Example 17, the filter layer of the method of Example 16 is juxtaposed and in contact with the fixed magnetic layer.

In Example 18, the material of the insertion layer of the method of any of Examples 16 or 17 is amorphous.

In Example 19, the material of the insertion layer of the method of any of Examples 16 or 17 is at least partially crystalline.

In Example 20, the material of the insertion layer of the method of any of Examples 16 or 17 is an alloy.

In Example 21, a nonvolatile memory device is made by the method of any of Examples 16-20.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A material layer stack for a magnetic tunneling junction, the material layer stack comprising:
   a dielectric layer between a fixed magnetic layer and a free magnetic layer;
   a filter layer directly on the fixed magnetic layer; and
   an insertion layer adjacent the free magnetic layer, wherein the insertion layer is in direct contact with the free magnetic layer, and
   wherein at least one of the insertion layer and the filter layer comprises a material having a magnetic flux density of one tesla or less.

2. The material layer stack of claim 1, wherein the magnetic flux density of the material of the at least one of the insertion layer and the filter layer is in a range of 0.1 tesla to 1 tesla.

3. The material layer stack of claim 1, wherein each of the insertion layer and the filter layer comprises a material having a magnetic flux density of one tesla or less.

4. The material layer stack of claim 1, wherein the material of the at least one of the insertion layer and the filter layer is amorphous.

5. The material layer stack of claim 4, wherein the material comprises cobalt zirconium tantalum.

6. The material layer stack of claim 1, wherein the material of the at least one of the insertion layer and the filter layer is at least partially crystalline.

7. The material layer stack of claim 1, wherein the material of the at least one of the insertion layer and the filter layer is an alloy.

8. The material layer stack of claim 1, wherein a surface anisotropy between the at least one of the insertion layer and the filter layer and a magnetic layer is greater than 0.5 millijoules per square meter.

9. A nonvolatile memory device comprising:
a material stack comprising:
a dielectric layer between a fixed magnetic layer and a free magnetic layer;
a filter layer directly on the fixed magnetic layer;
an insertion layer adjacent the free magnetic layer, wherein the insertion layer is in direct contact with the free magnetic layer, and wherein at least one of the insertion layer and the filter layer comprises a material having a magnetic flux density of one tesla or less;
a first electrode disposed on a first side of the material stack;
a second electrode disposed on a second side of the material stack; and
a transistor device coupled to the first electrode or the second electrode.

10. The device of claim 9, wherein the magnetic flux density of the material of the at least one of the insertion layer and the filter layer is in a range of 0.1 tesla to 1 tesla.

11. The device of claim 9, wherein each of the insertion layer and the filter layer comprises a material having a magnetic flux density of one tesla or less.

12. The device of 9, wherein the material of the at least one of the insertion layer and the filter layer is amorphous.

13. The device of claim 9, wherein the material of the at least one of the insertion layer and the filter layer is at least partially crystalline.

14. The device of any of claim 9, wherein the material of the at least one of the insertion layer and the filter layer is an alloy.

15. The device of any of claim 9, wherein a surface anisotropy between the at least one of the insertion layer and the filter layer and the fixed magnetic layer and free magnetic layer is greater than 0.5 millijoules per square meter.

16. A material layer stack for a magnetic tunneling junction, the material layer stack comprising:
a dielectric layer between a fixed magnetic layer and a free magnetic layer;
a filter layer adjacent the fixed magnetic layer; and
an insertion layer adjacent the free magnetic layer, wherein the insertion layer is in direct contact with the free magnetic layer, and
wherein each of the insertion layer and the filter layer comprises a material having a magnetic flux density of one tesla or less.

17. A nonvolatile memory device comprising:
a material stack comprising:
a dielectric layer between a fixed magnetic layer and a free magnetic layer;
a filter layer adjacent the fixed magnetic layer;
an insertion layer adjacent the free magnetic layer, wherein the insertion layer is in direct contact with the free magnetic layer, and wherein each of the insertion layer and the filter layer comprises a material having a magnetic flux density of one tesla or less;
a first electrode disposed on a first side of the material stack;
a second electrode disposed on a second side of the material stack; and
a transistor device coupled to the first electrode or the second electrode.

* * * * *